US012574664B2

(12) United States Patent
Wang et al.

(10) Patent No.: US 12,574,664 B2
(45) Date of Patent: Mar. 10, 2026

(54) CIS PIXEL READOUT CIRCUIT STRUCTURE AND METHOD FOR FABRICATING THE SAME

(71) Applicant: Shanghai Huali Integrated Circuit Corporation, Shanghai (CN)

(72) Inventors: Qiwei Wang, Shanghai (CN); Zhen Gu, Shanghai (CN); Haoyu Chen, Shanghai (CN); Lei Zhang, Shanghai (CN); Zhi Tian, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 50 days.

(21) Appl. No.: 18/810,384

(22) Filed: Aug. 20, 2024

(65) Prior Publication Data

US 2025/0150735 A1 May 8, 2025

(30) Foreign Application Priority Data

Nov. 7, 2023 (CN) .......................... 202311475123.6

(51) Int. Cl.
*H04N 25/78* (2023.01)
*H10F 39/00* (2025.01)
*H10F 39/18* (2025.01)

(52) U.S. Cl.
CPC ........... *H04N 25/78* (2023.01); *H10F 39/014* (2025.01); *H10F 39/18* (2025.01); *H10F 39/80373* (2025.01)

(58) Field of Classification Search
CPC ..... H04N 25/78; H10F 39/014; H10F 39/018; H10F 39/80373
See application file for complete search history.

(56) References Cited

U.S. PATENT DOCUMENTS

| | | | | |
|---|---|---|---|---|
| 7,119,387 B2 * | 10/2006 | Ohkawa | ................ | H10F 39/807 |
| | | | | 257/292 |
| 12,262,129 B2 * | 3/2025 | Ejiri | ...................... | H10F 39/807 |
| 2006/0011952 A1 * | 1/2006 | Ohkawa | ................ | H10F 39/813 |
| | | | | 257/292 |
| 2022/0077207 A1 * | 3/2022 | Ejiri | ...................... | H04N 25/78 |

* cited by examiner

*Primary Examiner* — Nicholas G Giles
(74) *Attorney, Agent, or Firm* — Quarles & Brady LLP

(57) ABSTRACT

This application discloses a CIS pixel readout circuit structure. An SG and an SF adopt different transverse thicknesses of spacers. The spacer of the SG adopts a smaller transverse thickness to reduce the parasitic resistance. The spacer of the SF adopts a larger transverse thickness to reduce the GIDL current. In the CIS pixel readout circuit structure according to this application, drain metal plugs are formed on outer sides of both left and right ends of an SF gate structure. The SF and the SG form a T-shaped combined compact structure to achieve equivalent parallel connection of two SF, thus effectively reducing the parasitic resistance of the share active area between the SG and the SF, and simultaneously saving the space area. This application further discloses a method for fabricating a CIS pixel readout circuit structure.

15 Claims, 10 Drawing Sheets

163
161
151
100

CIS PIXEL READOUT CIRCUIT STRUCTURE AND METHOD FOR FABRICATING THE SAME

CROSS-REFERENCE TO RELATED APPLICATIONS

This application claims priority to Chinese patent application No. 202311475123.6, filed on Nov. 7, 2023, the disclosure of which is incorporated herein by reference in its entirety.

TECHNICAL FIELD

This application relates to a CMOS Image Sensor (CIS) manufacturing technology, and in particular to a CIS pixel readout circuit structure and a method for fabricating the same.

BACKGROUND

A CMOS Image Sensor (CIS) is composed of a pixel unit circuit and a CMOS circuit. The pixel unit circuit is located in a pixel area. The CMOS circuit is a logic circuit located in a logic area. Compared with CCD image sensors, MOS image sensors have better integration capabilities due to the use of a CMOS standard fabrication process, which can be integrated with other digital and analog operation and control circuits on the same chip, and are more suitable for future development. According to the number of transistors contained in the pixel unit circuits of the existing CMOS image sensors, they are mainly divided into 3T CMOS image sensors and 4T CMOS image sensors.

FIG. 1 illustrates an equivalent circuit diagram of a pixel unit circuit of a typical 3T CMOS image sensor, which includes a photodiode (PD) D1 and a CMOS pixel readout circuit. The CMOS pixel readout circuit is a 3T type pixel circuit, including a reset transistor M1, a source follower transistor (SF) M2 and a select transistor (SG) M3, all of which are NMOS transistors. An N-type area of the photodiode D1 is connected with a source of the reset transistor M1. A gate of the reset transistor M1 is connected with a reset signal Reset. The reset signal Reset is a potential pulse. When the reset signal Reset is at a high level, the reset transistor M1 is conducted and absorbs electrons of the photodiode D1 into a power supply Vdd of the readout circuit to achieve reset. When illuminated by light, the photodiode D1 generates photo-induced electrons, the potential increases, and the electrical signal is transmitted through an amplification circuit. A gate of the select transistor M3 is connected with a line select signal RS and used for selecting to output the amplified electrical signal as an output signal Vout.

FIG. 2 illustrates an equivalent circuit diagram of a pixel unit circuit of a typical 4T CMOS image sensor. The difference from the structure illustrated in FIG. 1 is that there is an additional transfer transistor or pass transistor M4 in the structure illustrated in FIG. 2. A source area of the transfer transistor M4 is an N-type area connected with the photodiode D1. A drain area of the transfer transistor M4 is a Floating Diffusion (FD) area. A gate of the transfer transistor M4 is connected with a transmission control signal Tx. After the photodiode D1 generates photo-induced electrons, they are transferred to the floating diffusion area through the transfer transistor M4, and then connected to the gate of the source follower transistor (SF) M2 through the floating diffusion area to achieve signal amplification.

With the continuous reduction of pixel units, the space for placing a combined structure of the source follower transistor (SF) and the select transistor (SG) is also getting smaller and smaller. A decrease in the width of the source follower transistor (SF) will lead to a decrease in transconductance (Gm), which will influence the noise of the CMOS image sensor. Even if W/L is proportionally reduced and the transconductance (Gm) remains unchanged, due to the decrease in W*L size, 1/f noise will increase. As pixels shrink, all spaces will be fully utilized to maintain the performance of the combined structure of the SF and the SG.

A combined structure of a source follower transistor (SF) and a select transistor (SG) of an existing CIS pixel readout circuit is as illustrated in FIG. 3, and its equivalent circuit is as illustrated in FIG. 4. As pixels shrink, it will lead to a decrease in transconductance (Gm) and a significant increase in 1/f noise.

In the combined structure of the source follower transistor (SF) and the select transistor (SG) of the existing CIS pixel readout circuit, referring to FIG. 5, when the size of pixel units shrinks by half, the SF proportionally shrinks and the transconductance (Gm) is reduced by half.

BRIEF SUMMARY

This application provides a CIS pixel readout circuit structure, wherein a P-well is formed at an upper part of a semiconductor substrate;

SF gate poly and SG gate poly are formed on the P-well;

the left-right length of the SG gate poly is less than the left-right length of the SF gate poly, the SG gate poly is located on a rear side of a middle part of the SF gate poly, and a space exists between the SG gate poly and the SF gate poly;

the space is filled with silicon oxide;

the transverse thickness of spacer on a left side, a right side and a front side of the SF gate poly is greater than the transverse thickness of a spacer on a rear side of the SG gate poly;

a left drain metal plug of an SF is formed on a left side of a left spacer of the SF;

a right drain metal plug of the SF is formed on a right side of a right spacer of the SF;

a source metal plug of an SG is formed on a rear side of a rear spacer of the SG;

the left drain metal plug and the right drain metal plug of the SF are both used as drains of the SF for being externally connected with working voltage Vdd;

the source metal plug of the SG is used as a source of the SG for outputting CIS pixel readout voltage Vout.

In some embodiments, a rear N+ area is formed on a surface of the P-well on the rear side of the rear spacer of the SG gate poly;

a left N+ area is formed on a surface of the P-well on the left side of the left spacer of the SF gate poly;

a right N+ area is formed on a surface of the P-well on the right side of the right spacer of the SF gate poly;

a lower end of the left drain metal plug of the SF is connected to the left N+ area;

a lower end of the right drain metal plug of the SF is connected to the right N+ area;

a lower end of the source metal plug of the SG is connected to the rear N+ area.

In some embodiments, the front-rear width of the SG gate poly is less than the front-rear width of the SF gate poly.

In some embodiments, the pitch from the source metal plug of the SG to the SG gate poly is less than the pitch from the left drain metal plug and the right drain metal plug of the SF to the SF gate poly.

In some embodiments, the space between the SG gate poly and the middle part of the SF gate poly is less than 500 Å.

In some embodiments, the rear spacer of the SG gate poly is formed by transversely stacking a first spacer oxide layer on a first spacer SiN layer;

the left spacer, the right spacer and the front spacer of the SF gate poly are formed by transversely stacking a first spacer SiN layer on a second spacer oxide layer and then transversely stacking a first spacer oxide layer.

In some embodiments, the transverse thickness of the second spacer oxide layer is 10 Å-500 Å.

This application also provides a method for fabricating a CIS pixel readout circuit structure, which include the following steps:

S0: performing a P-well process on a semiconductor substrate to form a common P-well 100 for an SF and an SG;

S1: sequentially forming a gate oxide layer 110, a poly layer 120 and a hard mask layer 130 on the semiconductor substrate;

S2: performing a photolithography process and etching, and removing the poly layer 120 around an SF gate area and an SG gate area to form gate structures, the left-right length of the SG gate structure being less than the left-right width of the SG gate structure; the SG gate structure being located on a rear side of a middle part of the SF gate structure, a space existing therebetween;

S3: depositing a first spacer oxide layer 151, the first spacer oxide layer 151 filling the space between the SG gate structure and the SF gate structure;

S4: depositing a first spacer SiN layer 152;

S5: depositing a second spacer oxide layer 153;

S6: etching the second spacer oxide layer 153 till the first spacer SiN layer 152, reserving the second spacer oxide layer 153 on side surfaces of the gate structures, and removing the second spacer oxide layer 153 at other positions;

S7: performing a photolithography process and wet etching by using the first spacer SiN layer 152 as a stop layer, removing the second spacer oxide layer 153 on the side surface of the SG gate structure, and reserving the second spacer oxide layer 153 on the side surface of the SF gate structure to form an asymmetric structure;

S8: etching the first spacer SiN layer 152, reserving the first spacer SiN layer 152 on the side surfaces of the gate structures, and removing the first spacer SiN layer 152 at other positions to form an asymmetric spacer structure on a rear side of the SG gate structure and a front side of the SF gate structure, a spacer on the rear side of the SG gate structure being formed by transversely stacking a first spacer oxide layer 151 on a first spacer SiN layer 152, spacers on a left side, a right side and the front side of the SF gate structure being formed by transversely stacking a first spacer SiN layer 152 on a second spacer oxide layer 153 and then transversely stacking a first spacer oxide layer 151;

S9: forming a left drain metal plug and a right drain metal plug of the SF and a source metal plug of the SG, the left drain metal plug of the SF being located on a left side of a left spacer of the SF;

the right drain metal plug of the SF being located on a right side of a right spacer of the SF;

the source metal plug of the SG being located on a rear side of a rear spacer of the SG; and S10: performing subsequent processes.

In some embodiments, in step S1, the hard mask layer 130 is a composite structure formed by stacking a mask SiN layer 132 on a mask oxide layer 131;

step S2 includes the following steps:

S21: performing a photolithography process and etching the mask SiN layer 132 till the mask oxide layer 131;

S22: depositing a space SiN layer 133;

S23: etching the space SiN layer 133 till the mask oxide layer 131 to cover a peripheral side of the mask SiN layer 132 with the space SiN layer 133; and S24: etching the mask oxide layer 131 and the poly layer 120 till the gate oxide layer 110 to form gate structures.

In some embodiments, after step S24, rapid thermal oxidation treatment is firstly performed on gate poly to form side protection for the gate poly and repair etching damage of the gate poly, and then step S3 is performed.

In some embodiments, after step S2, a self-aligned LDD implantation process is performed by using a hard mask layer 130 to form a left LDD and a right LDD of the SF on a surface of the P-well at a left end and a right end of the SF gate structure and form a rear LDD of the SG on a surface of the P-well at a rear end of the SG gate structure, and then step S3 is performed.

In some embodiments, after LDD implantation is completed, SiN is removed through wet etching, and then step S3 is performed.

In some embodiments, step S9 includes the following steps:

S91: performing N+ ion implantation by adopting a self-alignment method to form a left N+ area of the SF on a surface of the left LDD of the SF, form a right N+ area of the SF on a surface of the right LDD of the SF and form a rear N+ area of the SG on a surface of the rear LDD of the SG; and S92: through an interlayer dielectric process and a contact process, forming a left drain metal plug of the SF communicated to the left N+ area on the left side of the left spacer of the SF;

forming a right drain metal plug of the SF communicated to the right N+ area on the right side of the right spacer of the SF; and forming a source metal plug of the SG communicated to the rear N+ area on the rear side of the rear spacer of the SG.

In some embodiments, in step S92, the interlayer dielectric process includes firstly depositing a silicide-blocked oxide layer 162, then depositing a contact etch stop layer 161, then depositing an interlayer dielectric 163 and performing chemical-mechanical polishing.

In some embodiments, in step S2, the front-rear width of the SG gate structure is less than the front-rear width of the SF gate structure;

the pitch from the source metal plug of the SG to the SG gate poly is less than the pitch from the left drain metal plug and the right drain metal plug of the SF to the SF gate poly;

the space between the SG gate structure and the middle part of the SF gate structure is less than 500 Å;

the transverse thickness of the second spacer oxide layer is 10 Å-500 Å.

In the CIS pixel readout circuit structure according to this application, the SG and SF adopt different transverse thicknesses of spacers. The spacer of the SG adopts a smaller transverse thickness to reduce the parasitic resistance. The spacer of the SF adopts a larger transverse thickness to reduce the Gate-Induced Drain Leakage (GIDL) current. In the CIS pixel readout circuit structure according to this application, drain metal plugs are formed on outer sides of both left and right ends of a source follower transistor (SF) gate structure and used as drains for being connected with working voltage Vdd. The source follower transistor (SF) is connected with a source of the select transistor (SG) through a common virtual source. The source follower transistor (SF) and the select transistor (SG) form a T-shaped combined compact structure to achieve equivalent parallel connection of two source follower transistors (SF1, SF2). Referring to FIG. 6 and FIG. 7, the equivalent width of the SF is a sum of left-right widths of two source follower transistors (SF1, SF2), thus effectively reducing the parasitic resistance of the share active area (share AA) between the SG and the SF, and simultaneously saving the space area. The combination of the source follower transistor (SF) and the select transistor in the CIS pixel readout circuit with the T-shaped structure is particularly suitable for the design of CIS with small pixel units below 1.0 µm, which can effectively utilize the space area and effectively reduce the problem caused by the SF width with the pixel unit size shrink. Referring to FIG. 8, since drain metal plugs for being connected with working voltage Vdd are formed at left and right ends of the source follower transistor (SF), the source follower transistor (SF) can be placed repeatedly and the working voltage Vdd can be shared, thus saving the effective area.

BRIEF DESCRIPTION OF THE DRAWINGS

In order to more clearly describe the technical solutions in this application, the following will briefly introduce the drawings needed in this application. It is obvious that the drawings in the following description are only some embodiments of this application. Those skilled in the art may obtain other drawings from these drawings without contributing any inventive labor.

DESCRIPTION OF REFERENCE SIGNS

100—P-well; 110—gate oxide layer; 120—poly layer; 130—hard mask layer; 131—mask oxide layer; 132— mask SiN layer; 133—space SiN layer; 151—first spacer oxide layer; 152—first spacer SiN layer; 153—second spacer oxide layer; 161—contact etch stop layer; 162—silicide-blocked oxide layer; 163—interlayer dielectric

DETAILED DESCRIPTION OF THE EMBODIMENTS

The technical solutions in the embodiments of this application will be clearly and completely described below with reference to the drawings in the embodiments of this application. Apparently, the described embodiments are merely some rather than all of the embodiments of this application. All other embodiments obtained by those skilled in the art based on the embodiments of this application without contributing any inventive labor shall still fall within the scope of protection of this application.

Words such as "first", "second" and the like used in this application do not indicate any order, quantity, or importance, but are only intended to distinguish different components. Words such as "comprising" or "including" refer to a component or object that appears before the word, including those listed after the word and their equivalents, without excluding other components or objects. Words like "connecting" or "connected" are not limited to physical or mechanical connections, but may include electrical connections, whether direct or indirect. "Up", "down", "left", "right", "front", "back" and the like are only intended to represent relative positional relationships. When the absolute position of a described object changes, the relative positional relationship may also change correspondingly.

It is to be understood that, without conflict, the embodiments and features in the embodiments of this application may be freely combined with each other.

Embodiment 1

Figure 1:
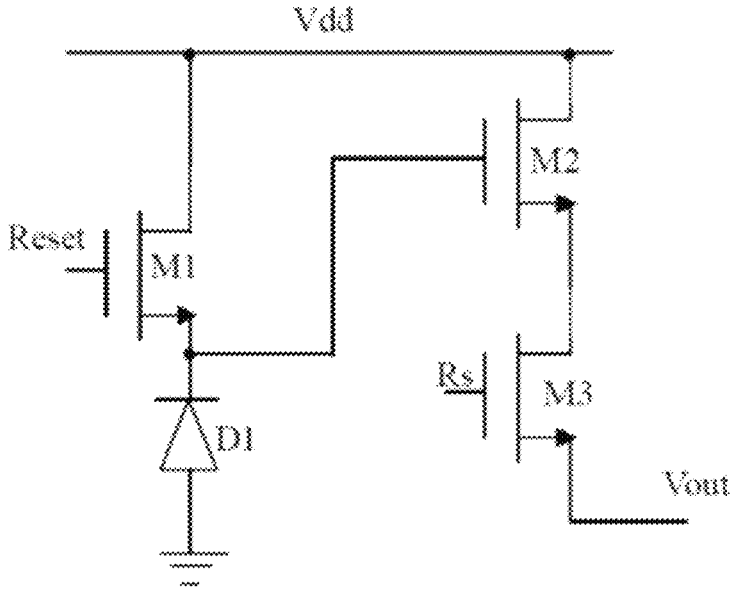
FIG. 1 illustrates an equivalent circuit diagram of a pixel unit circuit of a typical 3T CMOS image sensor.
Figure 2:
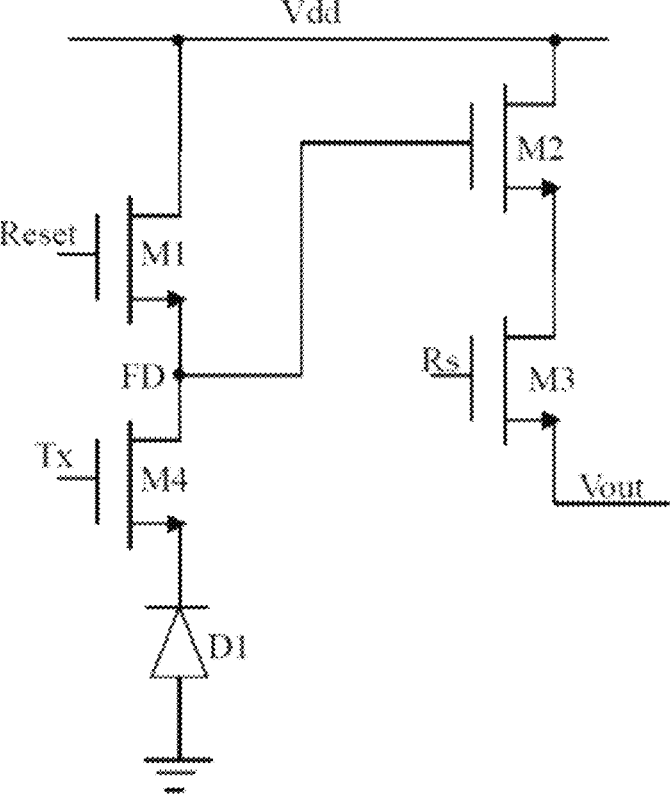
FIG. 2 illustrates an equivalent circuit diagram of a pixel unit circuit of a typical 4T CMOS image sensor.
Figure 3:
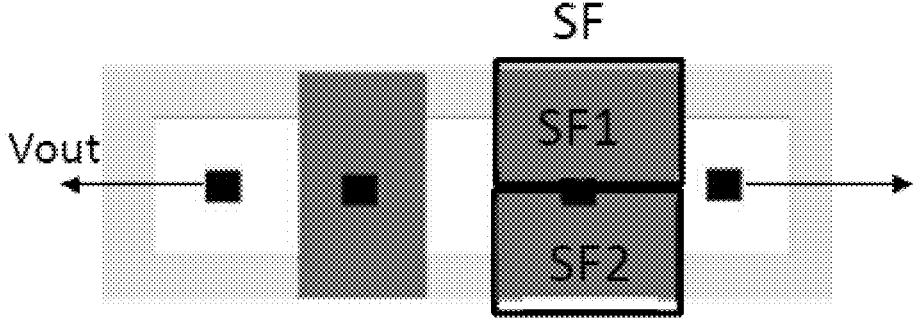
FIG. 3 illustrates a schematic diagram of a combined structure of a source follower transistor (SF) and a select transistor (SG) of an existing CIS pixel readout circuit structure.
Figure 4:
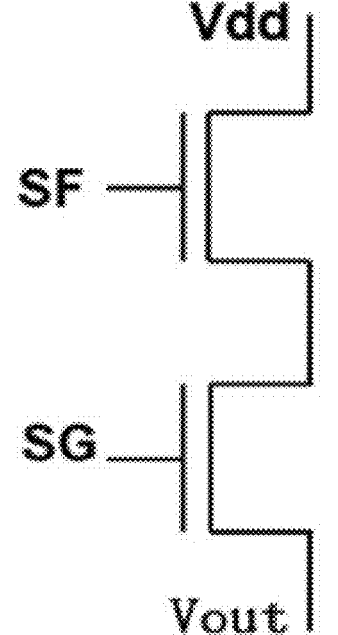
FIG. 4 illustrates an equivalent circuit diagram of the structure illustrated in FIG. 3.
Figure 5:
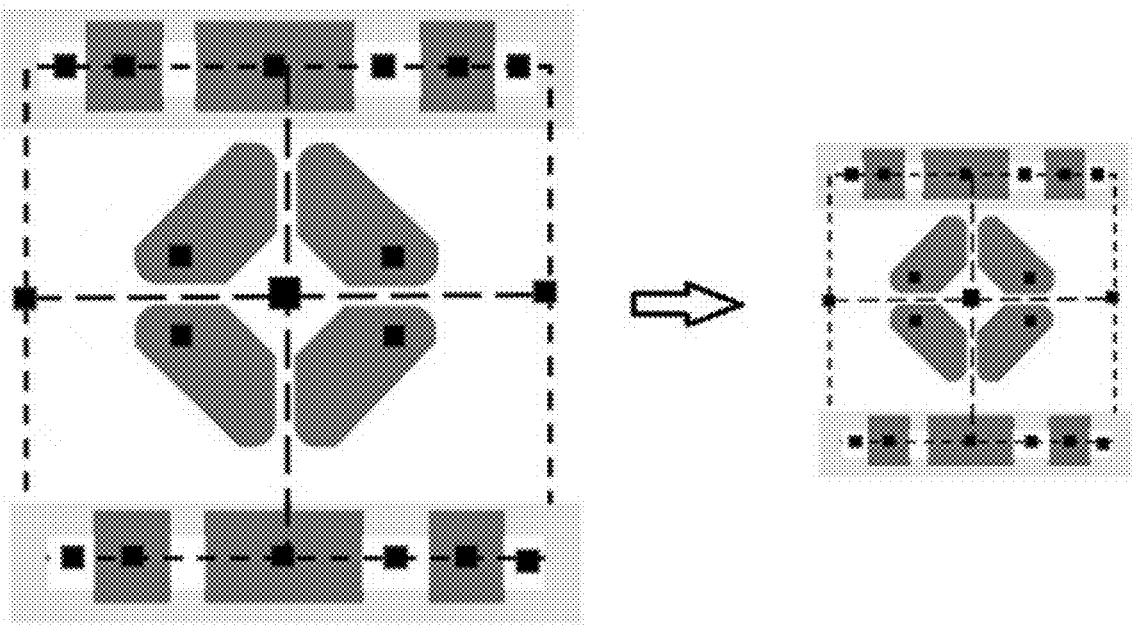
FIG. 5 illustrates a schematic diagram of an existing CIS pixel readout circuit when the size of pixel unit size shrinks by half.
Figure 6:
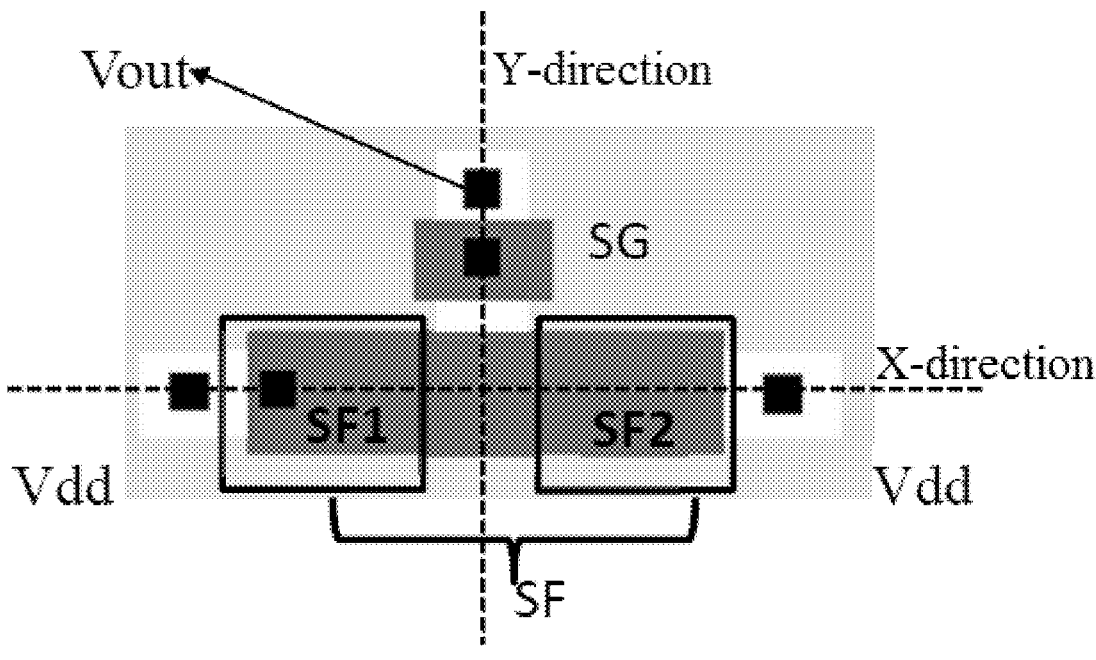
FIG. 6 illustrates a schematic diagram of a top surface of a CIS pixel readout circuit structure according to an embodiment of this application.
Figure 26:
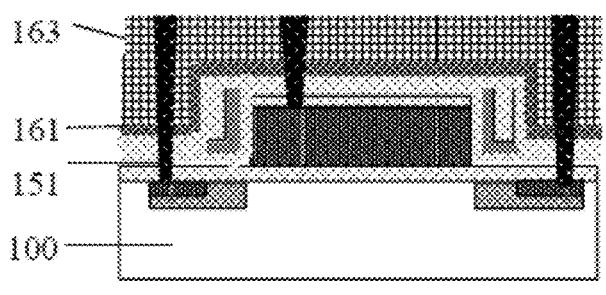
Figure 26:
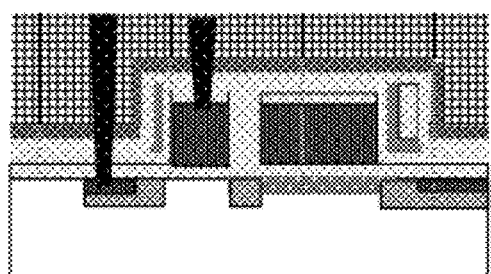

Provided is a CIS pixel readout circuit structure. Referring to FIG. 6 and FIG. 26, a P-well 100 is formed at an upper part of a semiconductor substrate.

Source follower transistor (SF) gate poly and select transistor (SG) gate poly are formed on the P-well 100.

The left-right (X-direction) length of the SG gate poly is less than the left-right length of the SF gate poly. The SG gate poly is located on a rear side of a middle part of the SF gate poly. A space exists between the SG gate poly and the SF gate poly.

The space is filled with silicon oxide.

The transverse thickness of spacer on a left side, a right side and a front side of the SF gate poly is greater than the transverse thickness of a spacer on a rear side of the SG gate poly.

A left drain metal plug of an SF is formed on a left side of a left spacer of the SF.

A right drain metal plug of the SF is formed on a right side of a right spacer of the SF.

A source metal plug of an SG is formed on a rear side of a rear spacer of the SG.

The left drain metal plug and the right drain metal plug of the SF are both used as drains of the SF for being externally connected with working voltage Vdd.

The source metal plug of the SG is used as a source of the SG for outputting CIS pixel readout voltage Vout.

In the CIS pixel readout circuit structure according to embodiment 1, the SG and SF adopt different transverse thicknesses of spacers. The spacer of the SG adopts a smaller transverse thickness to reduce the parasitic resistance. The spacer of the SF adopts a larger transverse thickness to reduce the Gate-Induced Drain Leakage (GIDL) current.

Figure 7:
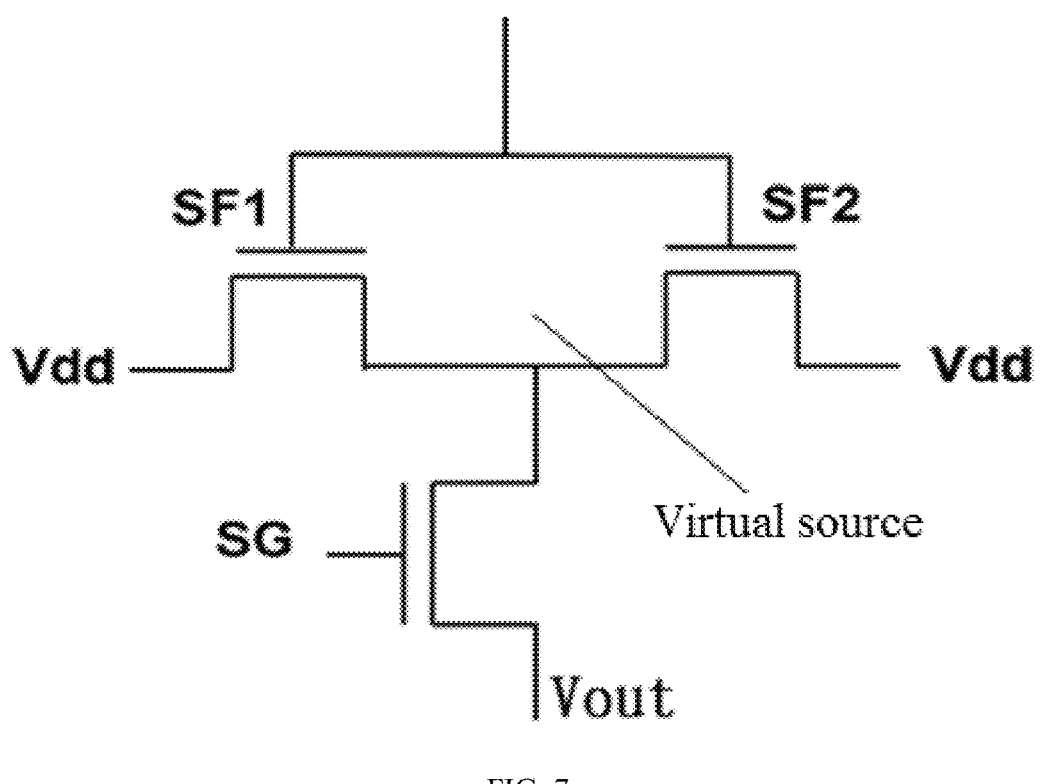
FIG. 7 illustrates an equivalent circuit diagram of a CIS pixel readout circuit structure according to an embodiment of this application.
Figure 8:
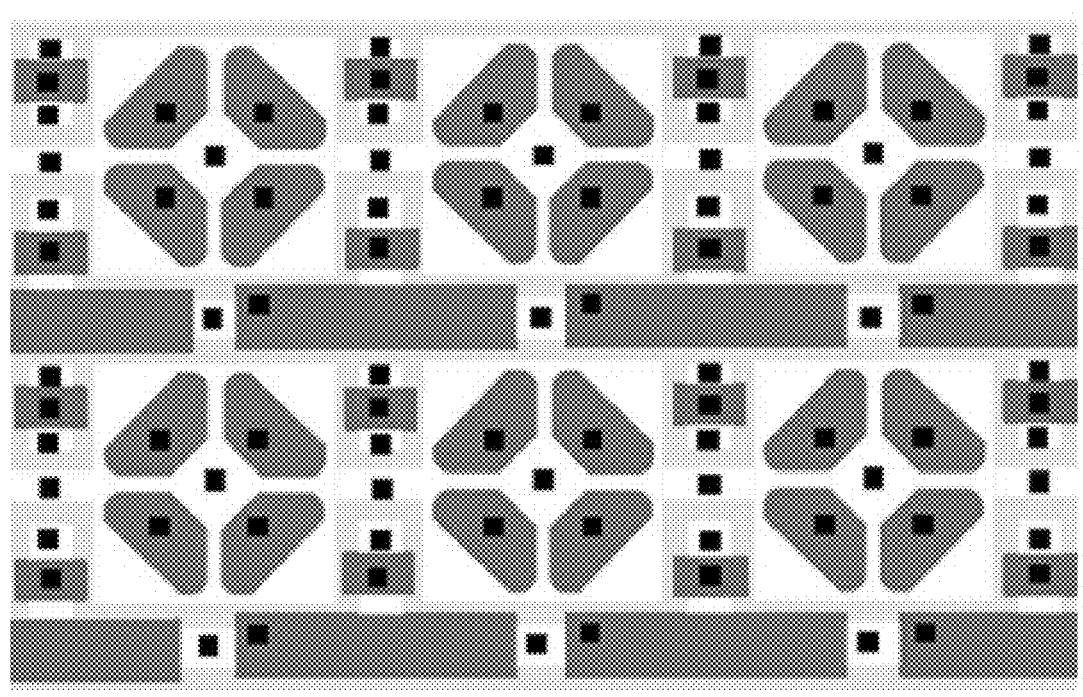
FIG. 8 illustrates a schematic diagram of a CIS array of a CIS pixel readout circuit structure according to an embodiment of this application.

In the CIS pixel readout circuit structure according to embodiment 1, drain metal plugs are formed on outer sides of both left and right ends of a source follower transistor (SF) gate structure and used as drains for being connected with working voltage Vdd. The source follower transistor (SF) is connected with a source of the select transistor (SG) through a common virtual source. The source follower transistor (SF) and the select transistor (SG) form a T-shaped combined compact structure to achieve equivalent parallel connection of two source follower transistors (SF1, SF2). Referring to FIG. 6 and FIG. 7, the equivalent width of the SF is a sum of left-right widths of two source follower transistors (SF1, SF2), thus effectively reducing the parasitic resistance of the share active area (share AA) between the SG and the SF, and simultaneously saving the space area. The combination of the source follower transistor (SF) and the select transistor in the CIS pixel readout circuit with the T-shaped structure is particularly suitable for the design of CIS with small pixel units below 1.0 μm, which can effectively utilize the space area and effectively reduce the problem caused by the SF width with the pixel unit size shrink. Referring to FIG. 8, since drain metal plugs for being connected with working voltage Vdd are formed at left and right ends of the source follower transistor (SF), the source follower transistor (SF) can be placed repeatedly and the working voltage Vdd can be shared, thus saving the effective area.

Embodiment 2

Based on the CIS pixel readout circuit structure according to embodiment 1, a rear N+ (N-type heavily doped) area is formed on a surface of the P-well on the rear side of the rear spacer of the SG gate poly.

A left N+ area is formed on a surface of the P-well on the left side of the left spacer of the SF gate poly.

A right N+ area is formed on a surface of the P-well on the right side of the right spacer of the SF gate poly.

A lower end of the left drain metal plug of the SF is connected to the left N+ area.

A lower end of the right drain metal plug of the SF is connected to the right N+ area.

A lower end of the source metal plug of the SG is connected to the rear N+ area.

In some embodiments, the front-rear (Y-direction) width of the SG gate poly is less than the front-rear width of the SF gate poly.

In some embodiments, the pitch from the source metal plug of the SG to the SG gate poly is less than the pitch from the left drain metal plug and the right drain metal plug of the SF to the SF gate poly. The pitch from the source metal plug of the SG to the gate poly is small, thus reducing the parasitic resistance. The pitch from the left drain metal plug and the right drain metal plug of the SF to the gate poly is large, thus reducing the Gate-Induced Drain Leakage (GIDL) current.

In some embodiments, the space between the SG gate poly and the middle part of the SF gate poly is less than 500 Å. The space between the SG gate poly and the middle part of the SF gate poly is reduced, thus reducing the parasitic resistance of the share active area (share AA).

In some embodiments, the rear spacer of the SG gate poly is formed by transversely stacking a first spacer oxide layer 151 on a first spacer SiN layer 152.

The left spacer, the right spacer and the front spacer of the SF gate poly are formed by transversely stacking a first spacer SiN layer 152 on a second spacer oxide layer 153 and then transversely stacking a first spacer oxide layer 151.

In some embodiments, the transverse thickness of the second spacer oxide layer is 10 Å-500 Å.

Embodiment 3

Provided is a method for fabricating a CIS pixel readout circuit structure, which includes the following steps:

In S0, a P-well process is performed on a semiconductor substrate to form a common P-well for a source follower transistor (SF) and a select transistor (SG).

Figure 9:
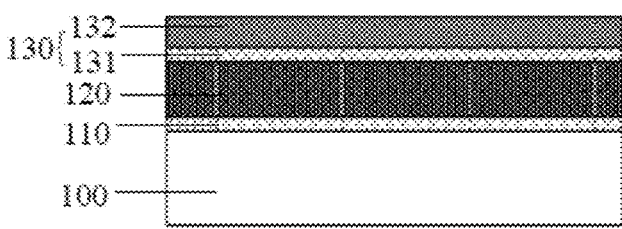
FIG. 9 to FIG. 26 illustrate schematic diagrams in steps of a method for fabricating a CIS pixel readout circuit structure according to an embodiment of this application.
Figure 9:
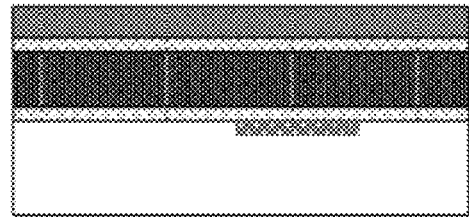

In S1, referring to FIG. 9, a gate oxide layer 110, a poly layer 120 and a hard mask layer 130 are sequentially formed on the semiconductor substrate.

In S2, a photolithography process and etching are performed, and the poly layer 120 around an SF gate area and an SG gate area is removed to form gate structures. The left-right (X-direction) length of the SG gate structure is less than the left-right width of the SG gate structure. The SG gate structure is located on a rear side of a middle part of the SF gate structure, and a space exists therebetween, referring to FIG. 10 and FIG. 11.

Figure 16:
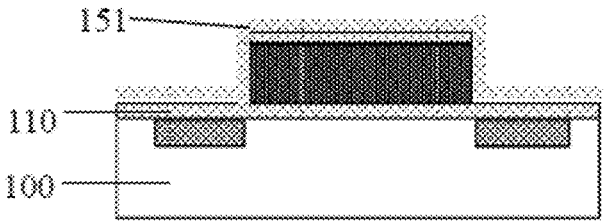
Figure 16:

In S3, referring to FIG. 16, a first spacer oxide layer 151 is deposited. The first spacer oxide layer 151 fills the space between the SG gate structure and the SF gate structure.

In S4, a first spacer SiN layer 152 is deposited.

Figure 17:
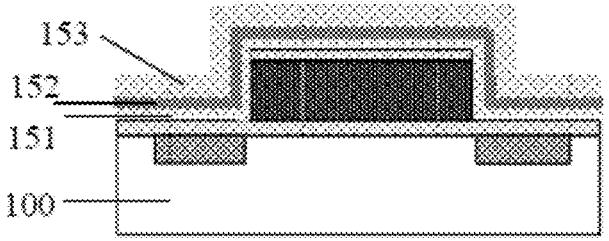
Figure 17:
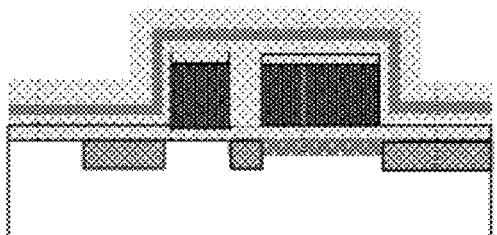

In S5, referring to FIG. 17, a second spacer oxide layer 153 is deposited.

Figure 18:
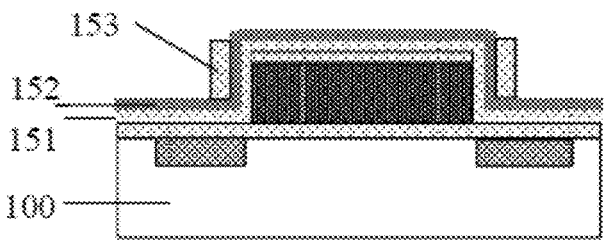
Figure 18:
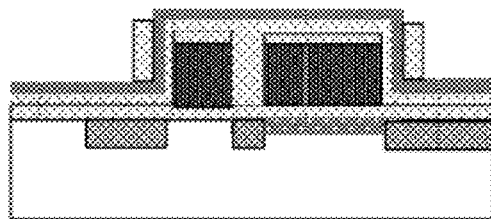

In S6, referring to FIG. 18, the second spacer oxide layer 153 is etched till the first spacer SiN layer 152, the second spacer oxide layer 153 on side surfaces of the gate structures is reserved, and the second spacer oxide layer 153 at other positions is removed.

Figure 19:
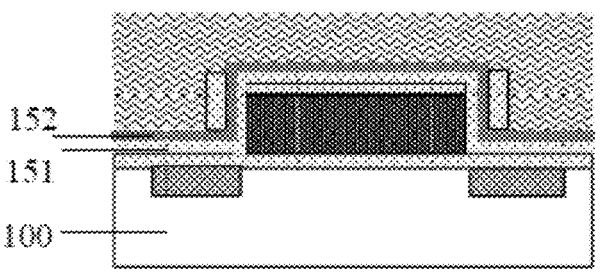
Figure 19:
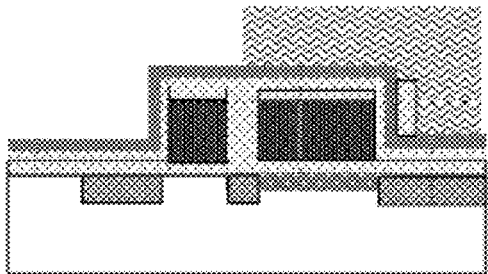
Figure 20:
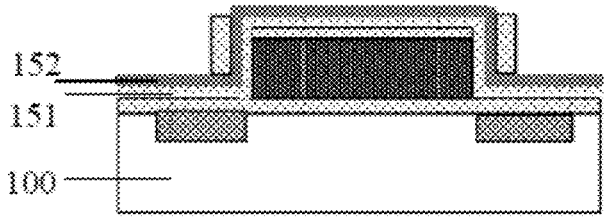
Figure 20:
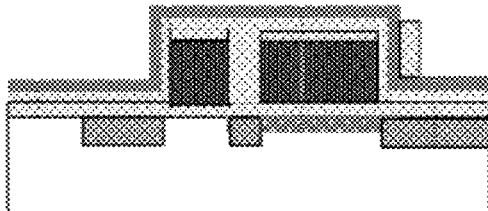

In S7, referring to FIG. 19 and FIG. 20, a photolithography process and wet etching are performed by using the first spacer SiN layer 152 as a stop layer, the second spacer oxide layer 153 on the side surface of the SG gate structure is removed, and the second spacer oxide layer 153 on the side surface of the SF gate structure is reserved to form an asymmetric structure.

Figure 21:
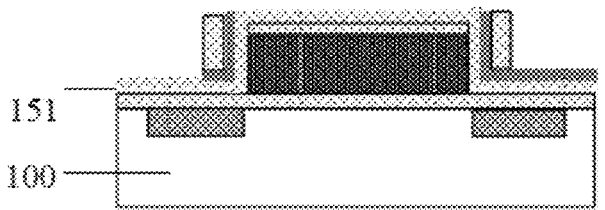
Figure 21:
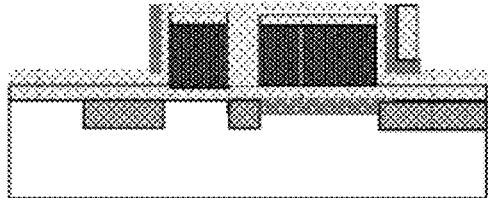
Figure 22:
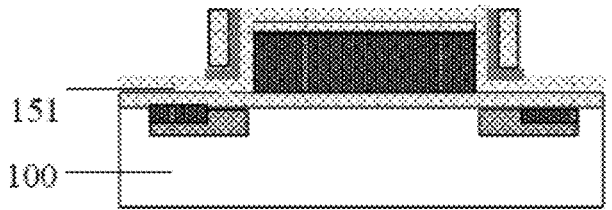
Figure 22:
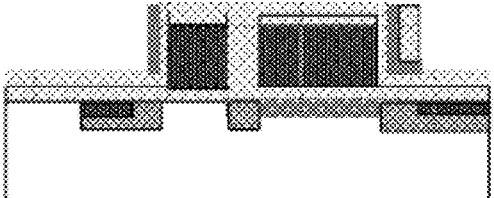

In S8, referring to FIG. 21, the first spacer SiN layer 152 is etched, the first spacer SiN layer 152 on the side surfaces of the gate structures is reserved, and the first spacer SiN layer 152 at other positions are removed to form an asymmetric spacer structure on a rear side of the SG gate structure and a front side of the SF gate structure. A spacer on the rear side of the SG gate structure is formed by transversely stacking a first spacer oxide layer 151 on a first spacer SiN layer 152. Spacer on a left side, a right side and the front side of the SF gate structure are formed by transversely stacking a first spacer SiN layer 152 on a second spacer oxide layer 153 and then transversely stacking a first spacer oxide layer 151. A difference between the transverse thicknesses of the spacers of the SG gate structure and the SF gate structure is defined through the second spacer oxide layer 153.

In S9, referring to FIG. 26, a left drain metal plug and a right drain metal plug of the SF and a source metal plug of the SG are formed.

The left drain metal plug of the SF is located on a left side of a left spacer of the SF.

The right drain metal plug of the SF is located on a right side of a right spacer of the SF.

The source metal plug of the SG is located on a rear side of a rear spacer of the SG.

In S10, subsequent processes are performed, which are the same as standard logic processes.

In the CIS pixel readout circuit structure fabricated by adopting the method for fabricating the CIS pixel readout circuit structure according to embodiment 3, both left and right ends of a source follower transistor (SF) gate structure are connected with working voltage Vdd. The source follower transistor (SF) is connected with a source of the select transistor (SG) through a common virtual source. The source follower transistor (SF) and the select transistor (SG) form a T-shaped combined compact structure to achieve equivalent parallel connection of two source follower transistors (SF), thus effectively reducing the parasitic resistance of the share active area (share AA) between the SG and the SF, and simultaneously saving the space area. The combination of the source follower transistor (SF) and the select transistor in the CIS pixel readout circuit with the T-shaped structure is particularly suitable for the design of CIS with small pixel units below 1.0 μm, which can effectively utilize the space area and effectively reduce the problem caused by the SF width with the pixel unit size shrink.

Embodiment 4

Based on the method for fabricating the CIS pixel readout circuit structure according to embodiment 3, referring to FIG. 9, in step S1, the hard mask layer 130 is a composite structure formed by stacking a mask SiN layer 132 on a mask oxide layer 131.

Figure 10:
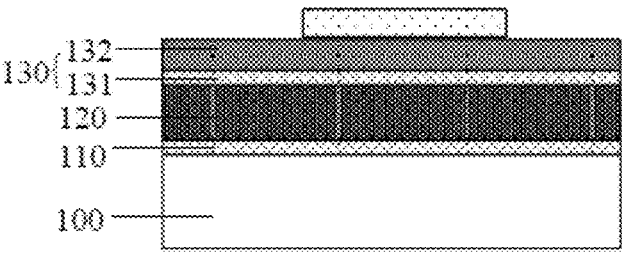
Figure 10:
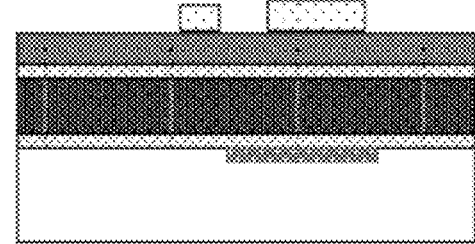
Figure 11:
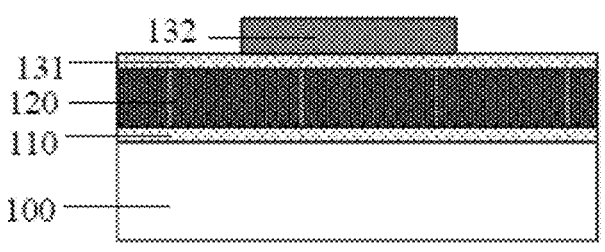
Figure 11:
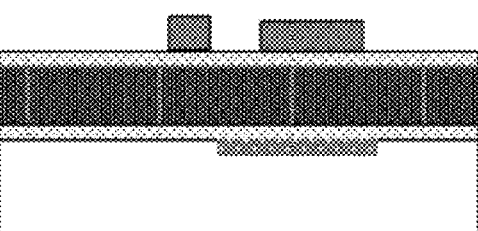

In some embodiments, step S2 includes the following steps:

In S21, referring to FIG. 10 and FIG. 11, a photolithography process is performed and the mask SiN layer 132 is etched till the mask oxide layer 131.

Figure 12:
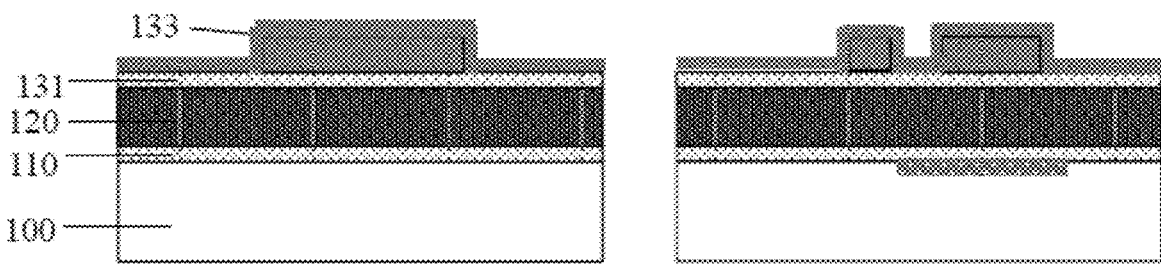

In S22, referring to FIG. 12, a space SiN layer 133 is deposited.

In S23, the space SiN layer 133 is etched till the mask oxide layer 131 to cover a peripheral side of the mask SiN layer 132 with the space SiN layer 133.

Figure 13:
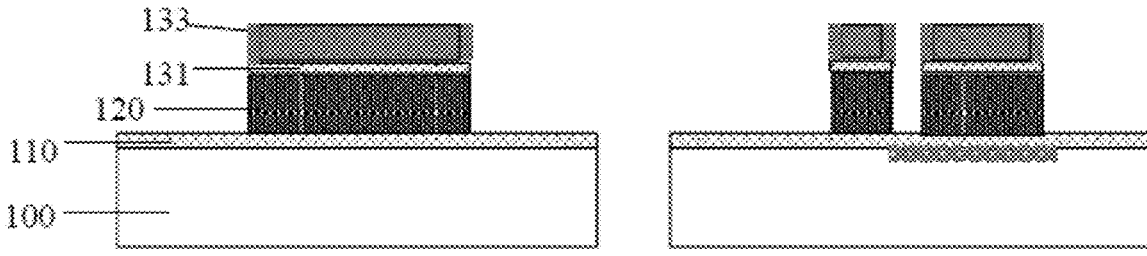
Figure 14:
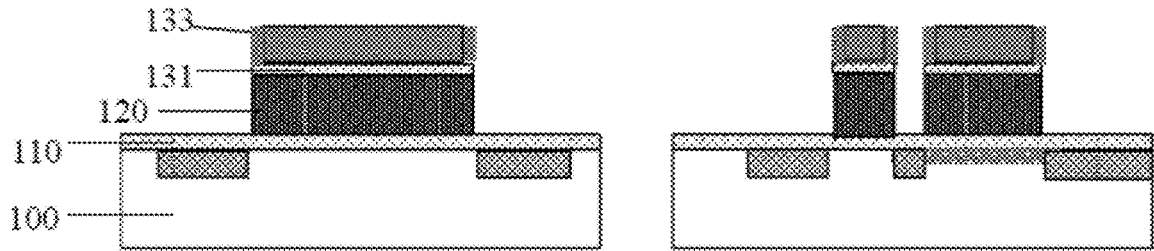

In S24, referring to FIG. 13, the mask oxide layer 131 and the poly layer 120 are etched till the gate oxide layer 110 to form gate structures.

Through this process, the space between the SG gate poly and the SF gate poly can be reduced. The main purpose of this process step is to solve the problem through this solution when the pitch from poly to poly exceeds the photolithography process capacity of the current process technology node, without requiring the mask and photoresist to be upgraded.

In some embodiments, after step S24, Rapid Thermal Oxidation (RTO) treatment is firstly performed on gate poly to form side protection for the gate poly and repair etching damage of the gate poly, and then step S3 is performed.

Embodiment 5

Based on the method for fabricating the CIS pixel readout circuit structure according to embodiment 4, after step S2, a self-aligned LDD implantation process is performed by using a hard mask layer 130 to form a left LDD and a right LDD of the SF on a surface of the P-well 100 at a left end and a right end of the SF gate structure and form a rear LDD of the SG on a surface of the P-well 100 at a rear end of the SG gate structure, and then step S3 is performed.

Figure 15:
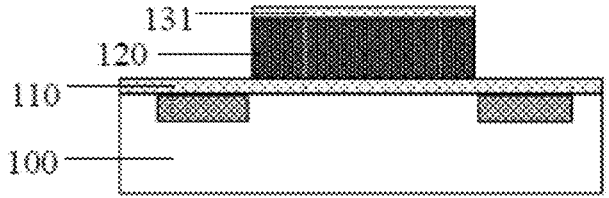
Figure 15:
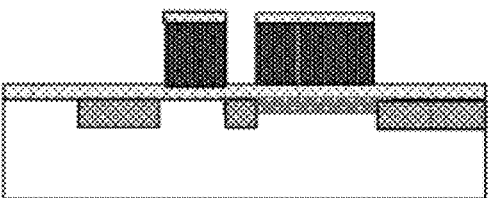

In some embodiments, referring to FIG. 15, after LDD implantation is completed, SiN is removed through wet etching; then step S3 is performed.

Embodiment 6

Based on the method for fabricating the CIS pixel readout circuit structure according to embodiment 5, step S9 includes the following steps:

In S91, referring to FIG. 16, N+ (N-type heavily doped) ion implantation is performed by adopting a self-alignment method to form a left N+ area of the SF on a surface of the left LDD of the SF, form a right N+ area of the SF on a surface of the right LDD of the SF and form a rear N+ area of the SG on a surface of the rear LDD of the SG; different pitches from the drain N+ area of the SF and the source N+ area of the SG to a channel are defined through a difference between the transverse thickness of the spacers on the left side and the right side of the SF and the transverse thickness of the spacer on the rear side of the SG.

In S92, through an interlayer dielectric process and a contact process, a left drain metal plug of the SF communicated to the left N+ area is formed on the left side of the left spacer of the SF;

> a right drain metal plug of the SF communicated to the right N+ area is formed on the right side of the right spacer of the SF; and
> a source metal plug of the SG communicated to the rear N+ area is formed on the rear side of the rear spacer of the SG.

Figure 23:
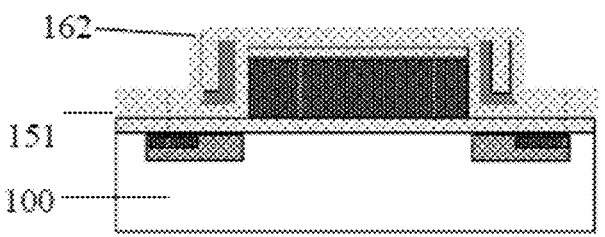
Figure 23:
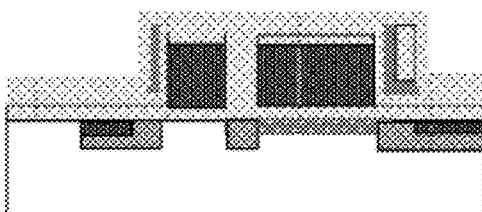
Figure 24:
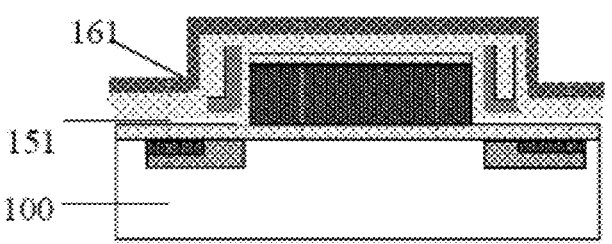
Figure 24:
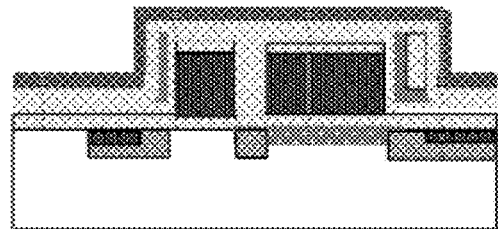
Figure 25:
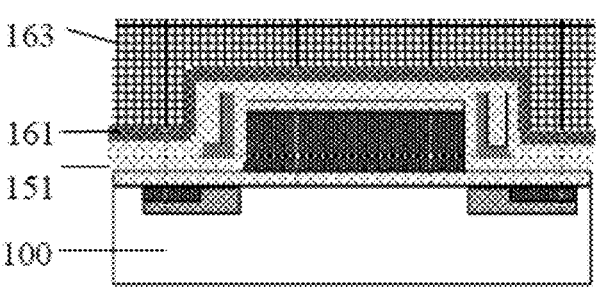
Figure 25:
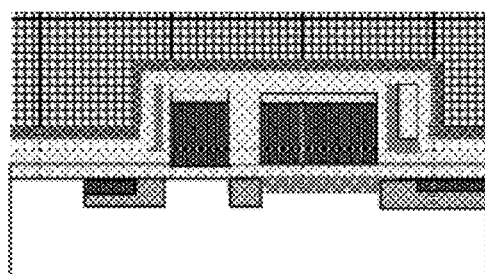

In some embodiments, in step S92, referring to FIG. 23, the interlayer dielectric process includes firstly depositing a silicide-blocked (SAB) oxide layer 162; then depositing a Contact Etch Stop Layer (CESL) 161, so as to improve the N transistor migration rate by adopting UV Tensile CESL; and then depositing an ILD (interlayer dielectric) 163 and performing chemical-mechanical polishing.

Embodiment 7

Based on the method for fabricating the CIS pixel readout circuit structure according to embodiment 5, in step S2, the front-rear (Y-direction) width of the SG gate structure is less than the front-rear width of the SF gate structure.

In some embodiments, the pitch from the source metal plug of the SG to the SG gate poly is less than the pitch from the left drain metal plug and the right drain metal plug of the SF to the SF gate poly.

In some embodiments, the space between the SG gate structure and the middle part of the SF gate structure is less than 500 Å.

In some embodiments, the transverse thickness of the second spacer oxide layer is 10 Å-500 Å.

What are described above are only exemplary embodiments of this application, and are not intended to limit this application. Any modifications, equivalent replacements, improvements and the like made within the spirit and principle of this application shall be all included in the scope of protection of this application.

What is claimed is:

1. A CIS (CMOS Image Sensor) pixel readout circuit structure, wherein a P-well is formed at an upper part of a semiconductor substrate;

> SF (Source Follower Transistor) gate poly and SG (Select Transistor) gate poly are formed on the P-well;
> the left-right length of the SG gate poly is less than the left-right length of the SF gate poly, the SG gate poly is located on a rear side of a middle part of the SF gate poly, and a space exists between the SG gate poly and the SF gate poly;
> the space is filled with silicon oxide;

a transverse thickness of a spacer on a left side, a right side and a front side of the SF gate poly is greater than the transverse thickness of a spacer on a rear side of the SG gate poly;

a left drain metal plug of an SF is formed on a left side of a left spacer of the SF;

a right drain metal plug of the SF is formed on a right side of a right spacer of the SF;

a source metal plug of an SG is formed on a rear side of a rear spacer of the SG;

the left drain metal plug and the right drain metal plug of the SF are both used as drains of the SF for being externally connected with working voltage;

the source metal plug of the SG is used as a source of the SG for outputting CIS pixel readout voltage.

2. The CIS pixel readout circuit structure according to claim 1, wherein a rear N+ area is formed on a surface of the P-well on the rear side of the rear spacer of the SG gate poly;

a left N+ area is formed on a surface of the P-well on the left side of the left spacer of the SF gate poly;

a right N+ area is formed on a surface of the P-well on the right side of the right spacer of the SF gate poly;

a lower end of the left drain metal plug of the SF is connected to the left N+ area;

a lower end of the right drain metal plug of the SF is connected to the right N+ area;

a lower end of the source metal plug of the SG is connected to the rear N+ area.

3. The CIS pixel readout circuit structure according to claim 1, wherein the front-rear width of the SG gate poly is less than the front-rear width of the SF gate poly.

4. The CIS pixel readout circuit structure according to claim 1, wherein a pitch from the source metal plug of the SG to the SG gate poly is less than a pitch from the left drain metal plug and the right drain metal plug of the SF to the SF gate poly.

5. The CIS pixel readout circuit structure according to claim 1, wherein the space between the SG gate poly and the middle part of the SF gate poly is less than 500 Å.

6. The CIS pixel readout circuit structure according to claim 1, wherein the rear spacer of the SG gate poly is formed by transversely stacking a first spacer oxide layer on a first spacer SiN layer;

the left spacer, the right spacer and the front spacer of the SF gate poly are formed by transversely stacking a first spacer SiN layer on a second spacer oxide layer and then transversely stacking a first spacer oxide layer.

7. The CIS pixel readout circuit structure according to claim 6, wherein the transverse thickness of the second spacer oxide layer is 10 Å-500 Å.

8. A method for fabricating a CIS (CMOS Image Sensor) pixel readout circuit structure, wherein the method for fabricating the CIS pixel readout circuit structure comprises the following steps:

S0: performing a P-well process on a semiconductor substrate to form a common P-well for an SF (Source Follower Transistor) and an SG (Select Transistor);

S1: sequentially forming a gate oxide layer, a poly layer and a hard mask layer on the semiconductor substrate;

S2: performing a photolithography process and etching, and removing the poly layer around an SF gate area and an SG gate area to form gate structures, the left-right length of the SG gate structure being less than the left-right width of the SG gate structure; the SG gate structure being located on a rear side of a middle part of the SF gate structure, a space existing therebetween;

S3: depositing a first spacer oxide layer, the first spacer oxide layer filling the space between the SG gate structure and the SF gate structure;

S4: depositing a first spacer SiN layer;

S5: depositing a second spacer oxide layer;

S6: etching the second spacer oxide layer till the first spacer SiN layer, reserving the second spacer oxide layer on side surfaces of the gate structures, and removing the second spacer oxide layer at other positions;

S7: performing a photolithography process and wet etching by using the first spacer SiN layer as a stop layer, removing the second spacer oxide layer on the side surface of the SG gate structure, and reserving the second spacer oxide layer on the side surface of the SF gate structure to form an asymmetric structure;

S8: etching the first spacer SiN layer, reserving the first spacer SiN layer on the side surfaces of the gate structures, and removing the first spacer SiN layer at other positions to form an asymmetric spacer structure on a rear side of the SG gate structure and a front side of the SF gate structure, a spacer on the rear side of the SG gate structure being formed by transversely stacking a first spacer oxide layer on a first spacer SiN layer, spacers on a left side, a right side and the front side of the SF gate structure being formed by transversely stacking a first spacer SiN layer on a second spacer oxide layer and then transversely stacking a first spacer oxide layer;

S9: forming a left drain metal plug and a right drain metal plug of the SF and a source metal plug of the SG, the left drain metal plug of the SF being located on a left side of a left spacer of the SF;

the right drain metal plug of the SF being located on a right side of a right spacer of the SF;

the source metal plug of the SG being located on a rear side of a rear spacer of the SG; and S10: performing subsequent processes.

9. The method for fabricating the CIS pixel readout circuit structure according to claim 8, wherein in step S1, the hard mask layer is a composite structure formed by stacking a mask SiN layer on a mask oxide layer;

step S2 comprises the following steps:

S21: performing a photolithography process and etching the mask SiN layer till the mask oxide layer;

S22: depositing a space SiN layer;

S23: etching the space SiN layer till the mask oxide layer to cover a peripheral side of the mask SiN layer with the space SiN layer; and S24: etching the mask oxide layer and the poly layer till the gate oxide layer to form gate structures.

10. The method for fabricating the CIS pixel readout circuit structure according to claim 9, wherein after step S24, rapid thermal oxidation treatment is firstly performed on gate poly to form side protection for the gate poly and repair etching damage of the gate poly, and then step S3 is performed.

11. The method for fabricating the CIS pixel readout circuit structure according to claim 9, wherein after step S2, a self-aligned LDD implantation process is performed by using a hard mask layer to form a left LDD and a right LDD of the SF on a surface of the P-well at a left end and a right end of the SF gate structure and form a rear LDD of the SG on a surface of the P-well at a rear end of the SG gate structure, and then step S3 is performed.

12. The method for fabricating the CIS pixel readout circuit structure according to claim 11, wherein after LDD implantation is completed, SiN is removed through wet etching, and then step S3 is performed.

13. The method for fabricating the CIS pixel readout circuit structure according to claim 11, wherein step S9 comprises the following steps:

S91: performing N+ ion implantation by adopting a self-alignment method to form a left N+ area of the SF on a surface of the left LDD of the SF, form a right N+ area of the SF on a surface of the right LDD of the SF and form a rear N+ area of the SG on a surface of the rear LDD of the SG; and S92: through an interlayer dielectric process and a contact process, forming a left drain metal plug of the SF communicated to the left N+ area on the left side of the left spacer of the SF;

forming a right drain metal plug of the SF communicated to the right N+ area on the right side of the right spacer of the SF; and forming a source metal plug of the SG communicated to the rear N+ area on the rear side of the rear spacer of the SG.

14. The method for fabricating the CIS pixel readout circuit structure according to claim 13, wherein in step S92, the interlayer dielectric process comprises firstly depositing a silicide-blocked oxide layer, then depositing a contact etch stop layer, then depositing an interlayer dielectric and performing chemical-mechanical polishing.

15. The method for fabricating the CIS pixel readout circuit structure according to claim 8, wherein in step S2, the front-rear width of the SG gate structure is less than the front-rear width of the SF gate structure;

a pitch from the source metal plug of the SG to the SG gate poly is less than a pitch from the left drain metal plug and the right drain metal plug of the SF to the SF gate poly;

the space between the SG gate structure and the middle part of the SF gate structure is less than 500 Å;

a transverse thickness of a the second spacer oxide layer is 10 Å-500 Å.

* * * * *